(12) United States Patent
McConnelee et al.

(10) Patent No.: US 8,742,558 B2
(45) Date of Patent: Jun. 3, 2014

(54) COMPONENT PROTECTION FOR ADVANCED PACKAGING APPLICATIONS

(75) Inventors: Paul Alan McConnelee, Schenectady, NY (US); Arun Virupaksha Gowda, Rexford, NY (US); Elizabeth Ann Burke, Mechanicville, NY (US); Kevin Matthew Durocher, Waterford, NY (US)

(73) Assignee: General Electric Company, Niskayuna, NY (US)

( * ) Notice: Subject to any disclaimer, the term of this patent is extended or adjusted under 35 U.S.C. 154(b) by 1078 days.

(21) Appl. No.: 12/154,289

(22) Filed: May 21, 2008

(65) Prior Publication Data

US 2009/0291296 A1 Nov. 26, 2009

(51) Int. Cl.
*H01L 23/02* (2006.01)

(52) U.S. Cl.
USPC .............. 257/678; 438/106; 257/E23.001

(58) Field of Classification Search
None
See application file for complete search history.

(56) References Cited

U.S. PATENT DOCUMENTS

| | | | |
|---|---|---|---|
| 5,334,259 A * | 8/1994 | Mizumura et al. | 136/258 |
| 5,353,195 A * | 10/1994 | Fillion et al. | 361/760 |
| 5,532,512 A * | 7/1996 | Fillion et al. | 257/686 |
| 6,306,680 B1 * | 10/2001 | Fillion et al. | 438/106 |
| 6,377,461 B1 * | 4/2002 | Ozmat et al. | 361/704 |
| 2004/0164432 A1 * | 8/2004 | Hsu et al. | 257/786 |
| 2008/0054298 A1 * | 3/2008 | Stevanovic et al. | 257/177 |
| 2008/0190748 A1 * | 8/2008 | Arthur et al. | 200/181 |

OTHER PUBLICATIONS

R. Fisher, R. Fillion, J. Burgess, and W. Hennessy; "High Frequency, Low Cost, Power Packaging Using Thin Film Power Overlay Technology"; Applied Power Electronics Conference and Exposition, Conference Proceedings Mar. 5-9, 1995; Tenth Annual, Dallas TX, USA; IEEE 1995; pp. 12-17.*

* cited by examiner

*Primary Examiner* — Leonard Chang

(74) *Attorney, Agent, or Firm* — Scott J. Asmus

(57) ABSTRACT

A method of protecting sensitive components prior to, during or subsequent to advanced die packaging processing includes applying a metal stack layer such as titanium/copper (Ti/Cu) onto the front surface of a die assembly such that the die assembly front surface is covered with the metal stack layer. A layer of titanium/copper/titanium (Ti/Cu/Ti) or a solder alloy is also applied to the back surface of the die assembly such that the back surface of the die assembly is covered with the Ti/Cu/Ti layer or solder alloy. The front surface metal stack layer and the back surface Ti/Cu/Ti layer or solder alloy prevent degradation of die metallization prior to, during or subsequent to the advanced die packaging processing.

7 Claims, 4 Drawing Sheets

COMPONENT PROTECTION FOR ADVANCED PACKAGING APPLICATIONS

BACKGROUND

The invention relates generally to component packaging processing and more particularly to multiple process sequences to protect sensitive embedded solid state components during advanced packaging process operations and/or second level assembly processing.

Active and passive solid state components often have thin bonding metals or alternate materials applied to them for subsequent bonding or process insertion steps for next level assembly processing. These metals or coating can be sensitive to processing treatments that could poison or otherwise have a negative impact on their performance. Examples of some coatings on the components include, without limitation, materials such as thin metals. Exemplary thin metals include Au, Ag, Pd, Ni, Sn, Pb, and so on. Other coatings could include organic coating such as an organic solderability preservative (OSP) or other encapsulant materials.

Keeping the foregoing discussion in mind, the dies used in certain power overlay (POL) modules have backside metallization, most of which have upper layers of nickel and silver. During the POL module processing, the silver gets oxidized (poisoned). This oxidation undesirably prevents the solder from wetting the nickel/silver during second level assembly, and has resulted in additional processing and rework steps to make the associated POL devices solderable and usable.

The foregoing component packaging problems have historically been addressed simply by protecting the backside of dies with blue membrane material or sealing Kapton to the backside of the dies to be protected. Another technique that has been employed is the use of backed carriers. These options protect the backs of the die(s) from chemical etching or attack. These options do not however protect the silver from oxidizing at the high temperatures used in the processing of silver backed dies.

Another technique for addressing the foregoing component packaging problems has been deposition of a Ti/Ni/Au layer over the die before starting the POL processing. This technique is undesirable due to the high cost and handling issues associated with very thin dies used in the POL process.

In view of the above, it would be both advantageous and beneficial to provide a robust backside metallization that is compatible with advanced processing and the POL process. It would be further beneficial if the robust backside metallization processing steps were compatible with existing manufacturing processing and equipment and resulted in a decrease in manual operations.

BRIEF DESCRIPTION

Briefly, in accordance with one embodiment, a method of protecting sensitive components prior to, during or subsequent to advanced die packaging processing, comprises:

applying a layer of titanium/copper (Ti/Cu) onto the front surface of a die assembly such that the die assembly front surface is covered with the Ti/Cu layer; and applying a layer of titanium/copper/titanium (Ti/Cu/Ti) or a solder alloy onto the back surface of the die assembly such that the back surface of the die assembly is covered with the Ti/Cu/Ti layer or solder alloy, and further such that the front surface Ti/Cu layer and the back surface Ti/Cu/Ti layer or solder alloy prevent degradation of die metallization prior to, during or subsequent to the advanced die packaging processing.

According to another embodiment, a die package assembly comprises:

a layer of titanium/copper (Ti/Cu) applied to the entire front outer surface of a die assembly such that each die front surface is covered with the Ti/Cu; and a layer of titanium/copper/titanium (Ti/Cu/Ti) or solder alloy applied to the entire back outer surface of the die assembly such that each die back surface is covered with the Ti/Cu/Ti or solder alloy, wherein the front surface Ti/Cu layer and the back surface Ti/Cu/Ti layer or solder alloy are configured to protect die metallization associated with each die front and back surface against degradation prior to, during, or subsequent to advanced processing of the die assembly.

According to yet another embodiment, a method of protecting sensitive components prior to, during or subsequent to advanced die packaging processing, comprises:

providing an adhesive element having at least one via there through, the adhesive element being attached to a frame element;

aligning a die with the at least one via and attaching the aligned die to the frame side of the adhesive element;

baking the aligned die and the adhesive element to cure the adhesive element and bond the aligned die to the adhesive element to form a die assembly;

applying titanium/copper (Ti/Cu) onto the front side of the die assembly opposite the frame side of the die assembly such that the front surface of the die assembly is covered with the front side Ti/Cu; and applying titanium/copper/titanium (Ti/Cu/Ti) or a solder alloy onto the frame side of the die assembly such that the back surface of the die assembly is covered with the frame side Ti/Cu/Ti or solder alloy.

According to still another embodiment, a method of protecting sensitive components prior to, during or subsequent to advanced die packaging processing, comprises:

applying a metal stack layer onto the front surface of a die assembly such that the die assembly front surface is covered with the metal stack layer; and applying a layer of titanium/copper/titanium (Ti/Cu/Ti) or a solder alloy onto the back surface of the die assembly such that the back surface of the die assembly is covered with the Ti/Cu/Ti layer or solder alloy, and further such that the front surface metal stack layer and the back surface Ti/Cu/Ti layer or solder alloy prevent degradation of die metallization prior to, during or subsequent to the advanced die packaging processing.

According to still another embodiment, a die package assembly comprises:

a metal stack layer applied to the entire front outer surface of a die assembly such that each die front surface is covered with the metal stack layer; and a layer of titanium/copper/titanium (Ti/Cu/Ti) or solder alloy applied to the entire back outer surface of the die assembly such that each die back surface is covered with the Ti/Cu/Ti or solder alloy, wherein the front surface metal stack layer and the back surface Ti/Cu/Ti layer or solder alloy are configured to protect die metallization associated with each die front and back surface against degradation prior to, during, or subsequent to advanced processing of the die assembly.

DRAWINGS

These and other features, aspects, and advantages of the present invention will become better understood when the following detailed description is read with reference to the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Multiple process sequences are described herein to protect sensitive components during advance packaging process operations and or second level assembly processing operations. Active or passive components often have thin bonding metals or alternate materials applied to them for subsequent bonding or process insertion steps for next level assembly as stated herein before. These metals or coating can be sensitive to processing treatments that could poison or have a negative impact on their performance. The process sequences described herein with reference to the Figures can provide a temporary mask for processing or be included in the final cross-sectional construction.

Process steps that might adversely affect sensitive components include without limitation, wet chemistries such as copper etch, resist strippers, seed metal etchants, gold etch, etc., plasma processing, elevated temperature process steps such as baking and curing steps that cause thermal degradation, e.g. oxidation. The process steps described herein can be supported across a number of process platforms for interconnect of single chip or multiple chip processes. Packaging areas affected can include, for example, chip on flex, system in package, chip scale packaging, power overlay, among others.

The dies used in power overlay (POL) modules for example, have backside metallization, most of which have upper layers of nickel and silver. During the POL process, the silver gets oxidized (poisoned). This oxidation prevents the solder from wetting the nickel/silver during second level assembly, resulting in further processing and rework to make the POL devices solderable and usable.

Figure 1:
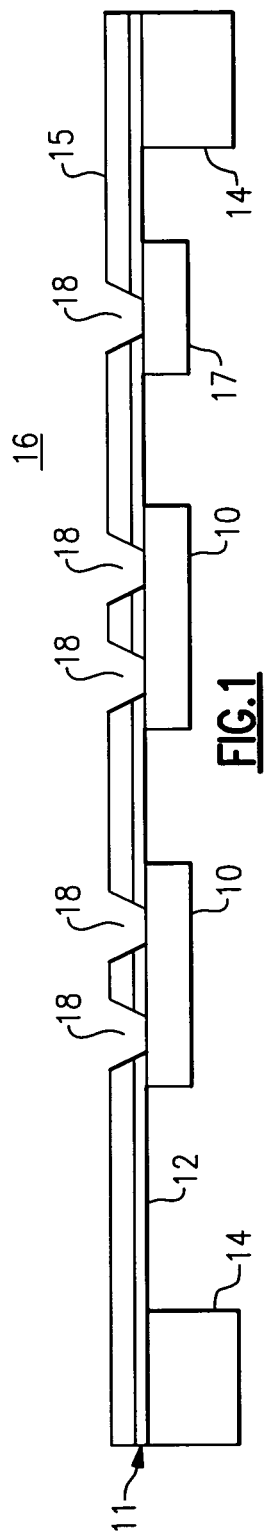
FIG. 1 is a diagram illustrating placement of dies onto an adhesive element according to one embodiment of the invention.

Looking now at FIG. 1, a diagram illustrates a first processing step of placing dies 10 onto an adhesive element 12 according to one embodiment of the invention. Subsequent to placement of the dies 10 onto the adhesive element 12, the adhesive element 12 is pressure baked to fully cure and bond the adhesive element 12 to the dies 10.

More specifically, an optional Kapton element 11 is first stretched across a frame element 14. A polyamine coating 15 is applied and provides a protective barrier to the front (top) side of the Kapton element 11. An adhesive 12 such as an XP adhesive is subsequently spun onto the frame side of the Kapton element to form a die assembly 16. Prior to curing the adhesive 12, vias 18 are formed and in one embodiment a laser is employed to form vias 18 through the Kapton 11 and the adhesive 12. The dies 10 are then aligned with the vias 18 as they are placed onto the adhesive 12, also prior to curing the adhesive 12.

In this example, the dies 10 are then permanently bonded to the Kapton 11 by the adhesive 12 as the adhesive 12 and the Kapton 11 are pressure baked according to one embodiment at about 180-190° C. to fully cure the adhesive 12 and form the die assembly 16 as stated above. Die assembly 16 also includes one or more shims 17 that provide a front to back electrical interconnection feedthrough for the assembly 16.

Although FIG. 1 depicts a single assembly 16, it can be appreciated that many such assemblies 16 are generally formulated simultaneously during the multiple processing steps described herein with reference to the figures. The actual number of assemblies 16 processed is dependent upon factors, including without limitation, the frame size and the type of application for which the dies are being used. The die can be, for example, an IGBT or a diode, among many others.

Figure 2:
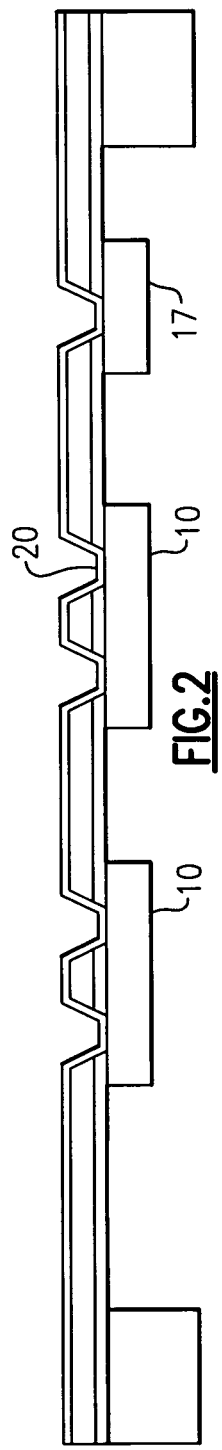
FIG. 2 is a diagram illustrating a sputtered Ti/Cu layer applied to the front side of the dies depicted in FIG. 1 according to one embodiment of the invention.

FIG. 2 is a diagram illustrating a sputtered Ti/Cu layer 20 on the entire front side of the die assembly 16 depicted in FIG. 1 that forms part of a power overlay module processing step according to one embodiment of the invention. These one or more Ti/Cu layers 20 may be formulated using, for example, a 3 kA/9 kA thickness or a 1 kA/3 kA thickness where the letter A represents Angstroms and the letter k represents the number 1000. Titanium is suitable for bonding to the Kapton as well as the die pads and shims 17 that are aligned with the vias 18. The shims can be any suitable metal such as copper with nickel metal finish and the die pads in one example are aluminum. The Ti/Cu layer 20 can be easily replaced with a different metal stack, e.g. Cr/Cu, TiW/Cu, and Ta/Cu since Ti is an adhesion layer. The Cu seed is sputtered in one embodiment since it is covered with a thick electroplated Cu. The Cu seed and electroplated cover could alternately be replaced with a different metal conductor such as Al, Mo, etc.

Figure 3:
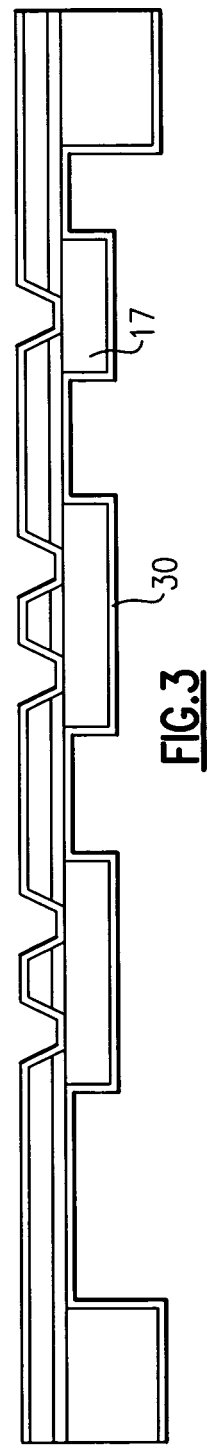
FIG. 3 is a diagram illustrating a sputtered Ti/Cu/Ti layer applied to the back side of the dies depicted in FIG. 2 according to one embodiment of the invention.

FIG. 3 is a diagram illustrating a sputtered Ti/Cu/Ti layer 30 applied to the back side of the die assembly 16 and associated dies 10 depicted in FIG. 2 according to one embodiment of the invention. The Ti/Cu/Ti layer 30 functions to protect any metal, e.g. silver and/or gold coating that is bonded to the back and side portions of the dies 10 and shims 17 such that the metal coating cannot be poisoned during subsequent die assembly processing steps. The Ti/Cu layer 20 and the Ti/Cu/Ti layer 30 are simultaneously applied to minimize processing steps during the die processing according to one embodiment. The Ti/Cu/Ti layer 30 can be easily replaced with a solder alloy such as described in more detail below.

The solder alloy will only stick to the backside of a die (where there is the Ni/Ag finish). The solder alloy will not stick to the backside of the Kapton or adhesive element such as done by the Ti/Cu/Ti. Further, since the solder alloy will be only at the die areas, there will be no need to apply the resist layer 50 described below, on the backside of the frame since there is nothing to etch away on the backside.

The foregoing processing step is particularly useful to complete additional processing steps to the dies 10 that are not otherwise achievable without poisoning the die surface metallization and to also implement device assemblies that cannot otherwise be formulated using conventional assembly processes known in the art.

Figure 4:
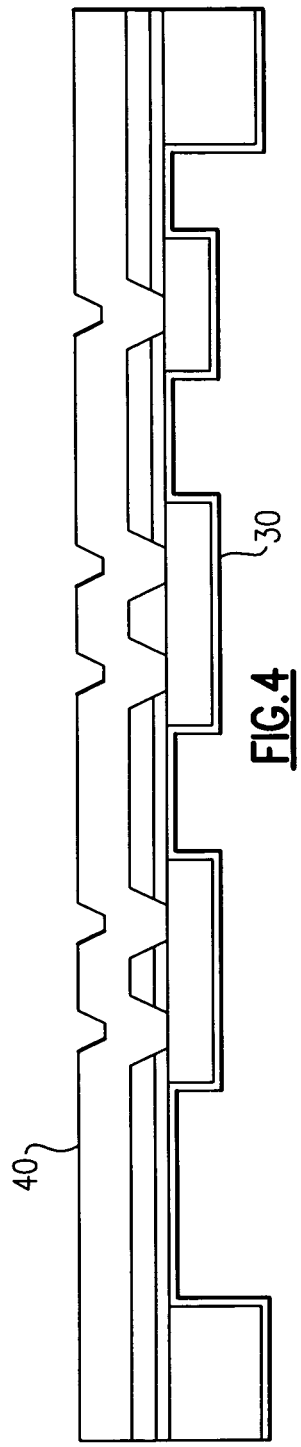
FIG. 4 is a diagram illustrating application of an electroplate layer on the front side of the dies depicted in FIG. 3 according to one embodiment of the invention.

FIG. 4 is a diagram illustrating an electroplate layer 40 on the front side of the dies depicted in FIG. 3 according to one embodiment of the invention. The electroplate layer 40 is deposited subsequent to the Ti/Cu/Ti sputtering step described above with reference to FIG. 3 and has a thickness that is dependent upon the specific application. According to one embodiment, the electroplate layer 40 comprises 5 mils of bright copper to provide a power overlay.

Figure 5:
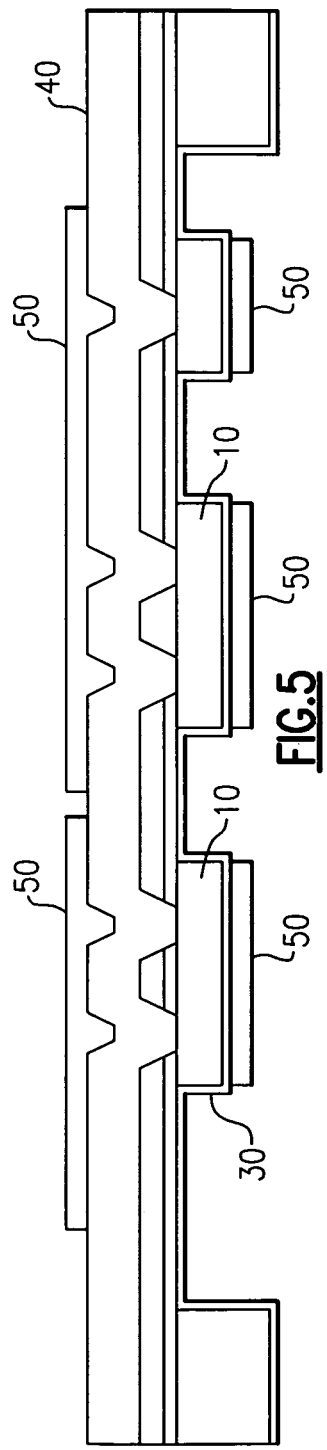
FIG. 5 is a diagram illustrating application of a film resist layer on the front and back sides of the dies depicted in FIG. 4 according to one embodiment of the invention.

FIG. 5 is a diagram illustrating a film resist layer 50 that is coated and exposed on at least some portions of the front side of the copper electroplate layer 40 and also on the sputtered Ti/Cu/Ti layer 30 back side portion of the dies 10 depicted in FIG. 4 according to one embodiment of the invention. Film resist layer 50 is also applied to the Ti/Cu/Ti layer 30 back side portion of any shims 17 that provide a front to back electrical interconnection feedthrough for the assembly 16.

Figure 6:
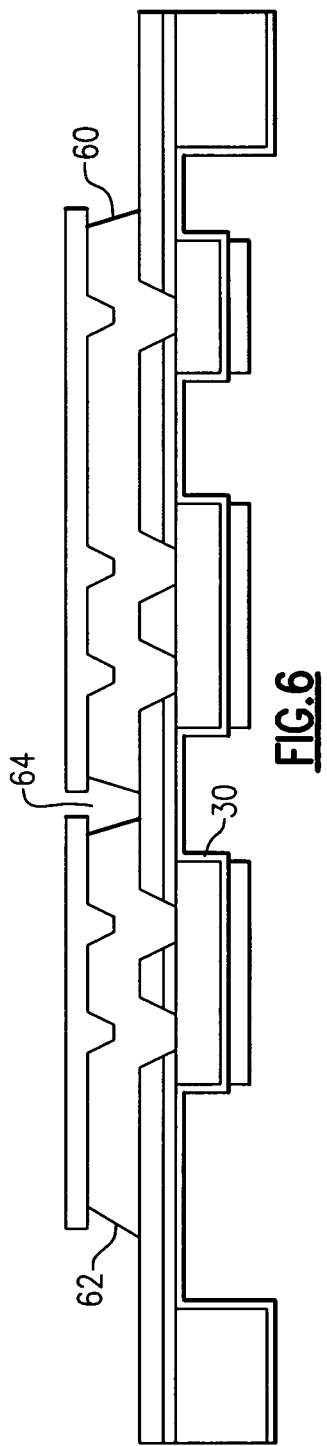
FIG. 6 is a diagram illustrating application of a thick copper etch layer on the front and back sides of the dies depicted in FIG. 5 according to one embodiment of the invention.

FIG. 6 is a diagram illustrating etching of the copper electroplate layer 40 to form copper etched patterns 60, 62 on the front side of the die assembly depicted in FIG. 5 according to one embodiment of the invention. A via 64 provides an electrical connection interface to etched patterns 60, 62 on the front side of the die assembly, while shim 17 provides a feedthrough electrical connection interface from front to back sides of the die assembly solely for etched pattern 60.

Figure 7:
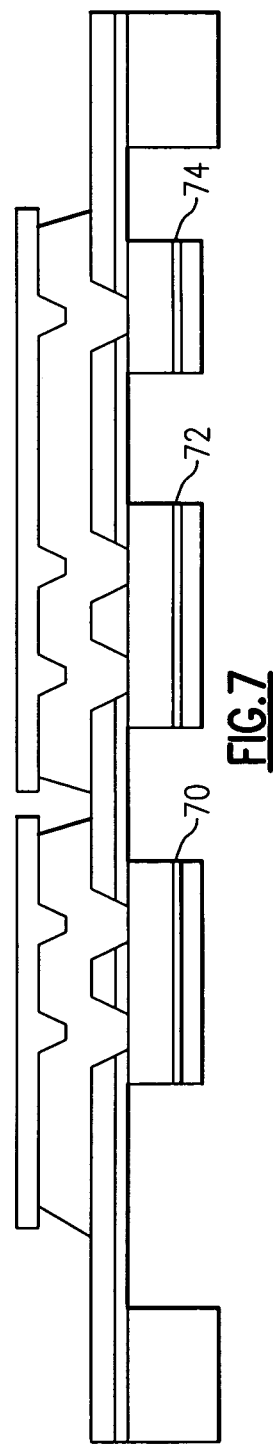
FIG. 7 is a diagram illustrating an etched Ti/Cu/Ti layer on the back side of the dies depicted in FIG. 6 according to one embodiment of the invention.

FIG. 7 is a diagram illustrating an etched Ti/Cu/Ti pattern 70 on the back side of the die assembly depicted in FIG. 6 according to one embodiment of the invention. Thus, layer 40 is etched to form pattern 60, 62 on the front side of the die assembly, while layer 30 is etched to form pattern 70, 72 and 74 on the back side of the die assembly.

Figure 8:
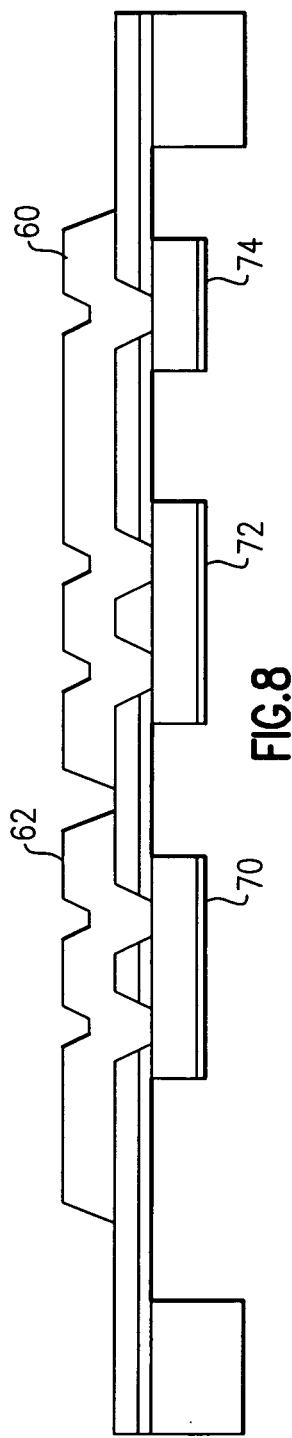
FIG. 8 is a diagram illustrating stripping of the resist layer on the front and back sides of the dies depicted in FIG. 7 according to one embodiment of the invention.

FIG. 8 is a diagram illustrating a strip resist process applied to the layers on the front and back sides of the dies depicted in FIG. 7 according to one embodiment of the invention. This strip resist process yields a patterned electroplate layer that includes pattern portions 60, 62 and in one embodiment comprises up to about 5 mils of bright copper on the front sides of the assembly to provide a desired power overlay.

Figure 9:
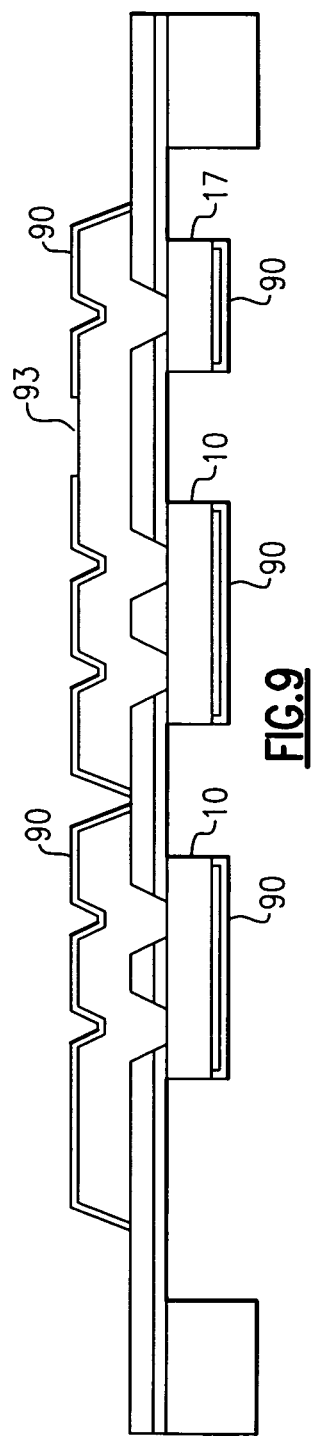
FIG. 9 is a diagram illustrating a soldermask applied to the front side of the dies depicted in FIG. 8 according to one embodiment of the invention.

FIG. 9 is a diagram illustrating a processing step of applying a soldermask 90 to the front side of the assembly depicted in FIG. 8. The soldermask 90 can be configured to also include one or more solder mask openings 93 that can used to bond wires or solder connectors to the assembly.

Figure 10:
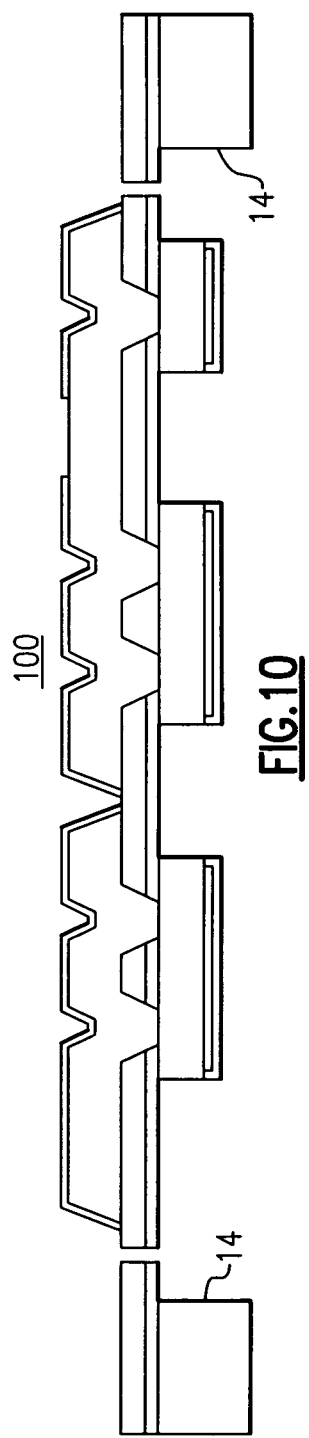
FIG. 10 is a diagram illustrating a completed and singulated module according to one embodiment of the invention.

Subsequent to final processing as shown in FIG. 9, the completed die assembly 100 is typically singulated from its associated frame 14 with a laser system according to one embodiment of the invention as depicted in FIG. 10.

Figure 11:
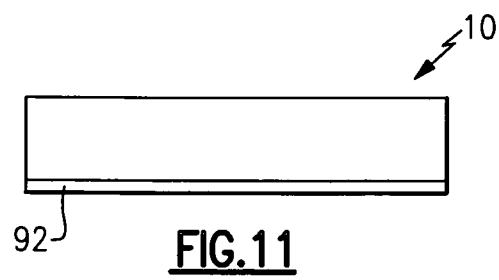
FIG. 11 illustrates a die that includes a layer of metallization.

FIG. 11 illustrates a more detailed representation of the die 10 that includes a layer of metallization 92 well known in the component packaging art. Further processing steps such as described above with reference to FIGS. 1-10 can be taken in order to provide increased protection of the die metallization 92 against poisoning from oxidation, chemical attack, depositions, and so on. These further processing steps can include the application of a solder alloy such as, but not limited to, Sn/Pb, SnAgCu or SnPbAg to the metallization layer 92 before, during or after the processing steps described above, keeping in mind that the solder alloy will replace the Ti/Cu/Ti layer 30 according to some embodiments.

Figure 12:
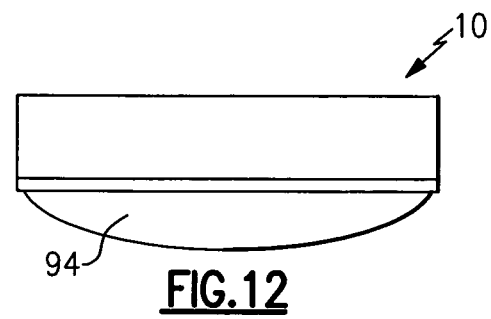
FIG. 12 illustrates a solder alloy applied to the layer of metallization depicted in FIG. 11.
Figure 13:
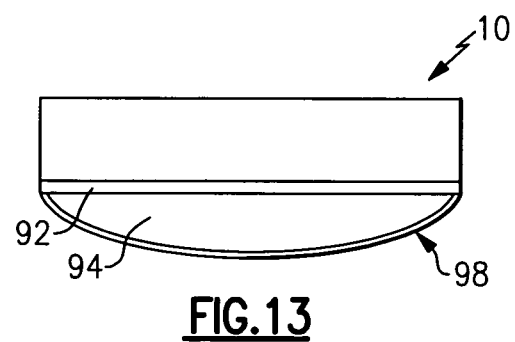
FIG. 13 illustrates poisoning of the solder alloy depicted in FIG. 12 during subsequent processing of the die shown in FIGS. 11-12.

Looking now at FIG. 12, a solder alloy 94 is applied to the layer of metallization 92 depicted in FIG. 11 before, during or after the processing steps described above. The solder alloy 94 is thus used as a replacement for the Ti/Cu/Ti layer 30 according to some embodiments of the invention, as stated above. The solder alloy 94 protects the metallization layer 92 against potential poisoning through all of the processing steps that occur subsequent to application of the solder alloy 94. FIG. 13 illustrates poisoning 98 of the solder alloy 94 depicted in FIG. 12 during subsequent processing of the die shown in FIGS. 11-12.

The layer of solder alloy 94 can have a thickness on the order of tens of microns as compared to the thickness of the metallization layer 92 that typically has a thickness of about one-half micron to about two microns. Although poisoning of the solder alloy 94 can itself occur, any such poisoning can be easily removed simply through use of a flux of by re-melting the solder alloy 94.

Figure 14:
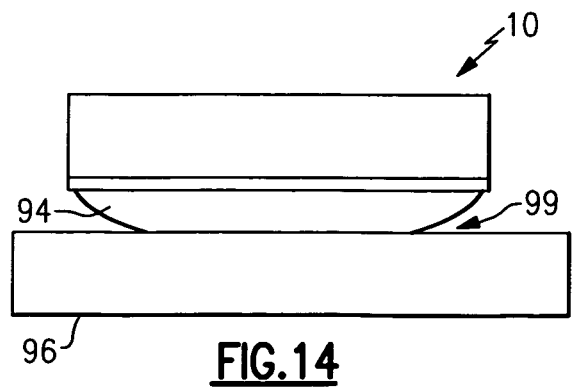
FIG. 14 illustrates the die shown in FIGS. 11 and 12 bonded to a substrate via the solder alloy shown in FIG. 12.

FIG. 14 illustrates the die 10 shown in FIGS. 11 and 12 bonded to a substrate 96 via the solder alloy 94 shown in FIG. 12, following the end of processing. The solder alloy 94 forms part of the joint 99 between the die 10 and the substrate 96. The joint 99 can be implemented using the same solder alloy 94 or a different solder alloy that is compatible with the solder alloy 94. The die/substrate joint 99 can be formed before the start of processing and before the die 10 is attached to the frame element 14 described above. The die/substrate joint 99 can also be formed prior to or subsequent to any of the intermediate processing steps described above with reference to FIGS. 1-10. Finally, the die/substrate joint 99 can be formed at the end of the process.

In summary explanation, a method of providing multiple process sequences to protect sensitive solid state components during advanced packaging process operations and/or second level assembly processing has been described with reference to FIGS. 1-14. These multiple process sequences are particularly useful during processing of assemblies in which electrical connections are formulated using direct bonding to the dies without the use of bonding wires. Use of wire bonds is particularly disadvantageous in high power devices since the wires undesirably add parasitic noise to the completed assembly.

The method advantageously provides a simple, fast, reliable and inexpensive solution for protecting the backsides of the dies during subsequent die packaging steps. This advantage is achieved in one aspect due to the presence of solderable backside metallization that is provided without requiring additional processing steps that would otherwise be necessary when using conventional processing techniques.

In a typical assembly using wirebonding, the die is first soldered to a substrate and then wirebonded. Thus, there is no need to protect the die metallization; and this process of protecting the die is not very relevant to a conventional wirebond packaging technique, but is very useful when die packaging processes are carried out on the front side and the die backside is soldered to the substrate towards the end of the die packaging process. The die backside is protected while the die front side processes are being carried out.

According to one aspect, copper and titanium are added to both the front and back sides of the assembly 16 simultaneously to allow further processing to be achieved using a single layer process versus a multiple layer process that would otherwise be necessary to implement subsequent assembly processing during an embedded chip process. The methods described herein are particularly useful for embedded chip processing applications where the dies are bonded to the film at the beginning of the processing instead of at the end of the processing such as generally done with conventional chip processes due to the use of wire bonding.

The processing steps described herein above with reference to the figures is very desirable to provide a structure that can be processed to achieve a desired end result without the use of wire bonds. These processing steps provide a simple, cost effective technique to protect die metallization from being damaged or poisoned in any way during the multiple processing steps required for embedded chip processing applications, among others.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A die package assembly comprising:
    a layer of titanium/copper (Ti/Cu) applied to the entire front outer surface of a power overlay assembly such that each die front surface is covered with the Ti/Cu; and
    a layer of titanium/copper/titanium (Ti/Cu/Ti) applied to the entire back outer surface of the power overlay assembly such that each die back surface is covered with the Ti/Cu/Ti.

2. The die package assembly according to claim 1, wherein the Ti/Cu layer has a respective thickness from about 1 kÅ/3 kÅ to about 3 kÅ/9 kÅ.

3. The die package assembly according to claim 1, wherein the Ti/Cu/Ti layer has a respective thickness from about 1 kÅ/3 kÅ/1 kÅ to about 3 kÅ/9 kÅ/3 kÅ.

4. The die package assembly according to claim 1, further comprising an adhesive layer covering the die front surface, wherein the adhesive layer comprises at least one via there through to the front surface of each die to form the die assembly.

5. The die package assembly according to claim 1, further comprising at least one substrate bonded to the back surface of at least one die package assembly die.

6. A die package assembly comprising:
    a metal stack layer applied to the entire front outer surface of a power overlay assembly such that each die front surface is covered with the metal stack layer; and
    a layer of titanium/copper/titanium (Ti/Cu/Ti) applied to the entire back outer surface of the power overlay assembly such that each die back surface is covered with the Ti/Cu/Ti.

7. The die package assembly according to claim 6, wherein the front surface metal stack layer is selected from Ti/Cu, Cr/Cu, TiW/Cu, and Ta/Cu.

* * * * *